United States Patent
Shumarayev et al.

(10) Patent No.: US 6,549,032 B1
(45) Date of Patent: Apr. 15, 2003

(54) INTEGRATED CIRCUIT DEVICES WITH POWER SUPPLY DETECTION CIRCUITRY

(75) Inventors: Sergey Y. Shumarayev, San Leandro, CA (US); Thomas H. White, Santa Clara, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 09/935,186

(22) Filed: Aug. 22, 2001

Related U.S. Application Data

(60) Provisional application No. 60/227,069, filed on Aug. 22, 2000.

(51) Int. Cl.[7] ............................................. H03K 19/003
(52) U.S. Cl. .............................. 326/33; 326/80; 327/535
(58) Field of Search ........................... 326/80, 81, 31, 326/33; 327/530, 538, 535

(56) References Cited

U.S. PATENT DOCUMENTS 5,870,342 A * 2/1999 Fukuda ................. 365/189.05
6,060,873 A * 5/2000 Ternullo et al. ............. 323/316
6,147,511 A 11/2000 Patel et al. ..................... 326/81

* cited by examiner

*Primary Examiner*—Don Le
(74) *Attorney, Agent, or Firm*—Fish and Neave; Robert R. Jackson; Jeffrey C. Aldridge

(57) ABSTRACT

Integrated circuit devices are provided that include power detection circuits that indicate whether power supplies have reached functional voltage levels. The power detection circuits include latches coupled to power supplies that can detect whether all the power supplies have reached functional voltage levels, logic circuits to provide appropriate output signals, and well bias circuits that supply current to the power detection circuits. Well bias circuits provide current from first power supplies to reach functional voltage levels so that indication may be provided from the power detection circuit without requiring functional voltage levels of all power supplies. Outputs from power detection circuits can be combined with control signals, for various applications. Applications include holding an integrated circuit device in reset until power supplies have reached functional voltage levels.

31 Claims, 5 Drawing Sheets

US 6,549,032 B1

INTEGRATED CIRCUIT DEVICES WITH POWER SUPPLY DETECTION CIRCUITRY

CROSS REFERENCES TO RELATED APPLICATIONS

This application claims the benefit of United States provisional patent application No. 60/227,069, filed Aug. 22, 2000, which is hereby incorporated by reference in its entirety.

BACKGROUND OF THE INVENTION

This invention relates to integrated circuit devices, and more particularly to integrated circuit devices coupled to multiple power supplies, that include power detection circuitry.

With the advent of high speed and low power applications for integrated circuit devices, integrated circuit devices have been developed that are supplied with currents from power supplies of different voltages. Generally, core processing logic within programmable logic devices is powered with lower voltage power supplies, and I/O (Input/Output) drivers that drive external signals are powered with higher voltage power supplies. For example, circuits within one integrated circuit device may be implemented with TTL (transistor-transistor logic), in which a logic-1 signal is nominally at 5 volts, while a logic-0 signal is nominally of zero voltage; LVTTL (Low Voltage TTL, which exists in a 3.3-volt version or a 2.5-volt version); PCI (Peripheral Component Interface, which may require a 3.3-volt power supply); SSTL (Series Stub Terminated Logic, which has several variants); GTL (Gunning Transceiver Logic); GTL+; and HSTL (High Speed Transceiver Logic, which has several variants). Additional signaling schemes that are based on other voltage levels have been developed, and continue to be developed.

Indication of whether all power supplies to an integrated circuit device have reached functional voltage levels may be useful for various applications. One application is to keep circuits within the integrated circuit device inactive through application of an internal reset signal that is further qualified by a signal that indicates whether all power supplies to the integrated circuit device have reached full/nominal rail levels, thereby preventing damage to the circuits. Therefore, it may be desirable to provide integrated circuit devices that include power detection circuits that indicate whether power supplies have reached functional voltage levels.

SUMMARY OF THE INVENTION

Integrated circuits, such as PLDs, in accordance with this invention include power detection circuits that indicate whether power supplies coupled to the integrated circuits have reached functional voltage levels. The power detection circuits typically include various latches, well bias circuits, and logic circuits that provide output signals to indicate whether power supplies that are being monitored have reached functional voltage levels.

In accordance with the principles of the present invention, a preset latch may be coupled to some clear latches that control the output of the power detection circuit. The preset latch controls the clear latches, and thus the output of the power detection circuit, when the monitored power supplies have not reached functional voltage levels. Under these conditions, the power detection circuit outputs a first logic level, indicating that the power supplies have not reached functional voltage levels.

When all power supplies monitored by the power detection circuit have reached functional voltage levels, the preset latch may be turned off, and the clear latches may then control the output signal of the power detection circuit. Under these conditions, the power detection circuit outputs a second logic level, indicating that the power supplies have reached functional voltage levels. Various logic circuits may be used to couple the preset latch with the clear latches. These logic circuits may be arranged for redundancy so that at least one logic circuit is powered up when a first power supply is at functional voltage level. Well bias circuits may be used to achieve this result.

Applications of power detection circuits include using the output signals of power detection circuits to condition reset signals, thereby holding integrated circuit devices in reset until power supplies have reached functional voltage levels. Circuits may be provided in accordance with the present invention that condition reset signals with outputs from power detection circuits so that a reset signal may be generated that is conditional upon power supplies reaching functional voltage levels.

DETAILED DESCRIPTION OF THE INVENTION

According to the principles of the present invention, an integrated circuit device (such as a programmable logic device) may be provided with one or more power detection circuits. The power detection circuits may monitor power supplies at various locations within the integrated circuit device. In one embodiment of the invention, power detection circuitry may be provided to monitor power supplies at each I/O pin of the integrated circuit device.

Figure 1:
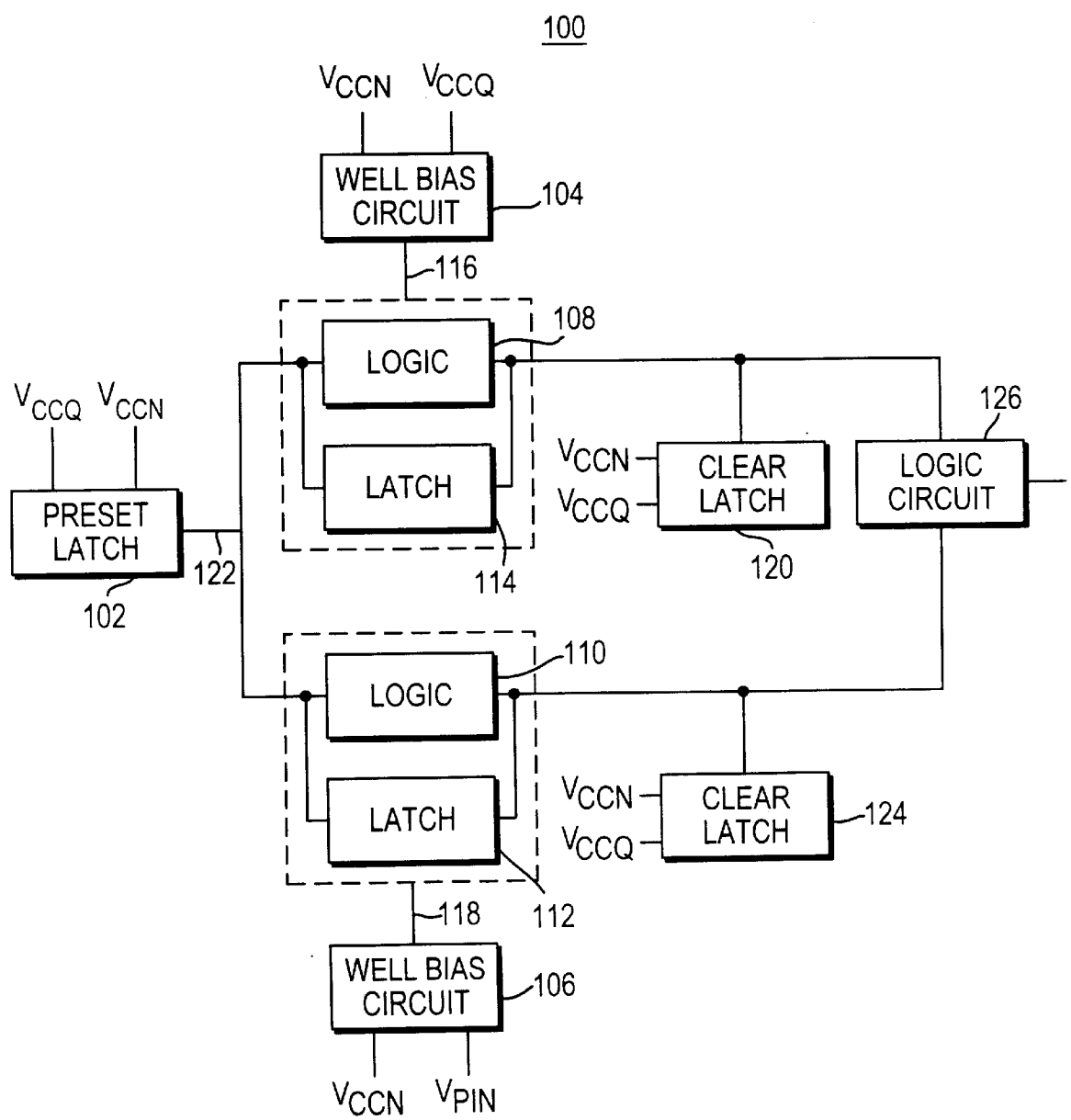
FIG. 1 is a simplified schematic block diagram of an illustrative power detection circuit constructed in accordance with the invention.

An illustrative power detection circuit in accordance with the present invention is shown in FIG. 1. Power detection circuit 100 includes preset latch 102, well bias circuits 104 and 106, logic circuits 108 and 110, latches 112 and 114, clear latches 120 and 124, and logic circuit 126.

Well bias circuits 104 and 106 may charge well bias outputs 116 and 118 to the highest voltage of the power supplies coupled to well bias circuits 104 and 106, thereby providing current from a first power supply to reach functional voltage level at outputs 116 and 118. Well bias outputs 116 and 118 are coupled to logic circuits 108 and 110, thus providing current to logic circuits 108 and 110 as soon as one of power supplies $V_{CCN}$, $V_{CCQ}$, and $V_{PIN}$ has reached functional voltage level (where $V_{PIN}$ is the voltage at the particular location that is being monitored, e.g., an I/O pin).

In effect, well bias circuits 104 and 106 may be configured to select a first power supply that reaches functional voltage level and to supply current from that first power supply to logic circuits 108 and 110. For example, well bias circuit 104 is coupled to two power supplies, $V_{CCN}$ and $V_{CCQ}$. If power supply $V_{CCN}$ has reached functional voltage level, and $V_{CCQ}$ has not reached functional voltage level, bias circuit 104 may be configured to cause well bias circuit output 116 to provide current to logic circuit 108 from power supply $V_{CCN}$.

Well bias circuits 104 and 106 may also be arranged so that each power supply monitored by power detection circuit 100 is coupled to at least one well bias circuit. For example, in FIG. 1, monitored power supplies $V_{CCN}$, $V_{CCQ}$, and $V_{PIN}$ are coupled to at least one well bias circuit. When one of these three power supplies has reached functional voltage level, one of logic circuits 108 and 110 is powered on.

As shown in FIG. 1, preset latch 102 is coupled to power supplies $V_{CCN}$ and $V_{CCQ}$. Preset latch 102 may be configured so that the output of preset latch 102 may be at logic-0 level when either power supply $V_{CCN}$ or $V_{CCQ}$ is not at functional voltage level. When both power supplies $V_{CCQ}$ and $V_{CCN}$ are at their respective functional voltage levels, then the output of preset latch 102 may be floating/tri-stated.

Figure 1A:
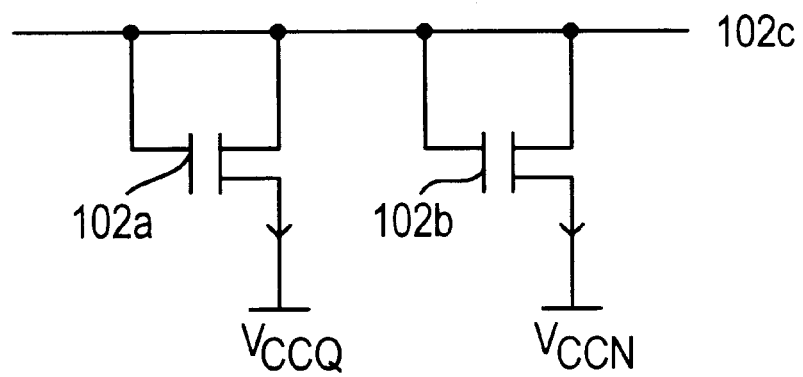
FIGS. 1a–c are more detailed but still simplified schematic block diagrams illustrating particular aspects of the FIG. 1 circuit.

In one embodiment of the invention, preset latch 102 may be implemented with two diode-connected transistors that are connected in parallel (when two power supplies are being monitored) wherein each transistor is also coupled to a monitored power supply. This embodiment is illustrated in FIG. 1a. FIG. 1a shows two diode-connected transistors 102a and 102b, which are connected in parallel. Transistor 102a is preferably coupled to power supply $V_{CCQ}$ and transistor 102b is preferably coupled to power supply $V_{CCN}$. When the power supply coupled to either transistor 102a or 102b is of zero voltage, the transistor is turned on, which forces output 102c (which corresponds to output 122 of FIG. 1) to a logic-0 level. When both power supplies have reached functional voltage levels, transistors 102a and 102b are off, thus tri-stating output 102c. In other embodiments of the invention, any suitable circuit that provides an appropriate logic level when its inputs have/have not reached functional voltage levels may be used in place of a preset latch.

Figure 1B:
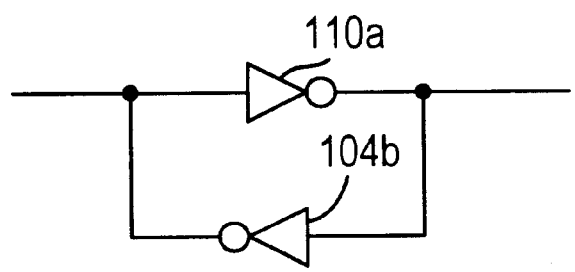

As illustrated in FIG. 1, logic circuits 108 and 110 may be coupled to preset latch 102 in order to invert the signal on output 122 of preset latch 102. Logic circuits 108 and 110 are identical to each other in function, and are arranged so that each is powered from a well bias circuit that selects between different power supplies. For example, logic circuit 108 is coupled to well bias circuit 104 while logic circuit 110 is coupled to well bias circuit 106. This arrangement of logic circuits 108 and 110 ensures that at least one of logic circuits 108 and 110 is powered up when one of power supplies $V_{CCN}$, $V_{CCQ}$ and $V_{PIN}$ has reached functional voltage level. As illustrated in FIG. 1b, each of logic circuits 108 and 110 may be implemented with inverter 110a so that a logic-1 level at the output of logic circuit 108 and 110 indicates that not all power supplies coupled to preset latch 102 have reached functional voltage levels.

Each of the outputs from logic circuits 108 and 110 may be coupled to clear latches 120 and 124 as illustrated in FIG. 1. When either power supply $V_{CCN}$ or $V_{CCQ}$ is not at functional voltage level, clear latches 120 and 124 are preferably turned off (i.e., the outputs of clear latches 120 and 124 are tri-stated), the outputs of clear latches 120 and 124 may be controlled by outputs from logic circuits 108 and 110, respectively, so that the outputs from clear latches 120 and 124 are held to logic-1 levels. When both power supplies $V_{CCN}$ and $V_{CCQ}$ are at functional voltage levels, preset latch 102 is preferably tri-stated while clear latches 120 and 124 may be configured to provide logic-0 levels on their outputs. In other embodiments of the invention, any suitable circuit that provides an appropriate logic level when its inputs have/have not reached functional voltage levels may be used in place of a clear latch.

When one output signal is desired to indicate that not all power supplies monitored by power detection circuit 100 have reached functional voltage levels, the outputs from clear latches 120 and 124 may be combined with logic circuit 126 to provide a HOTSCKT signal. Note that the output signal from power detection circuits in accordance with the present invention will be denoted as the "HOTSCKT" signal for convenience. Logic circuit 126 may be implemented with an OR-gate or any suitable combinatorial circuit. Logic circuit 126 may also be implemented such that it is powered up with any suitable power supply. For example, logic circuit 126 may be powered up from a power supply more likely to reach functional voltage level before any of power supplies $V_{CCN}$, $V_{CCQ}$ or $V_{PIN}$ so that power detection circuit 100 may provide an accurate HOTSCKT signal.

Figure 1C:
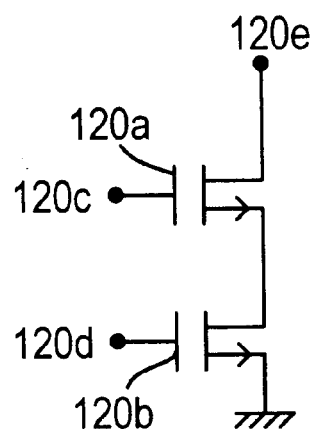

In one embodiment of the invention, clear latches 120 and 124 may be implemented with two transistors (when latches 120 and 124 are coupled to two power supplies), as illustrated in FIG. 1c. Each of clear latches 120 and 124 may be implemented with transistors 120a and 120b that are connected in series, as shown in FIG. 1c. When each of clear latches 120 and 124 is coupled to a power supply, each power supply may be coupled to inputs 120c and 120d, respectively. When both power supplies are at functional voltage levels (with the higher power supply coupled to input 120c), both transistors 120a and 120b may be turned on, and output 120e is preferably held to a logic-0 level. When either transistor 120a or 120b is turned off because either power supply coupled to inputs 120c and 120d are not at functional voltage levels, output 120e is preferably tri-stated.

In one embodiment of the invention, latches 114 and 112 may be coupled to logic circuits 108 and 110 in order to de-bounce output 122 of preset latch 102. Under some operating conditions, a spike in power supply voltages may cause output 122 of preset latch 102 to be momentarily at a logic-1 level instead of a logic-0 level, and vice-versa. Latches 114 and 112 may de-bounce the circuit under these operating conditions and ensure that spikes in power supply voltages do not cause instability of power detection circuit 100.

Thus, illustrative power detection circuit 100, as shown in FIG. 1, may provide an output signal, HOTSCKT, that is at a logic-0 level when both $V_{CCQ}$ and $V_{CCN}$ have reached functional voltage levels (unless $V_{CCQ}$ $V_{CCN}$, and $V_{PIN}$ are off). The level of the HOTSCKT signal is indicated in the following truth table (in relation to $V_{CCQ}$ $V_{CCN}$, and $V_{PIN}$):

| $V_{CCQ}$ | $V_{CCN}$ | $V_{PIN}$ | HOTSCKT |
|---|---|---|---|
| 0 | 0 | 0 | 0 |
| 0 | 0 | 1 | 1 |
| 0 | 1 | 0 | 1 |
| 0 | 1 | 1 | 1 |
| 1 | 0 | 0 | 1 |
| 1 | 0 | 1 | 1 |
| 1 | 1 | 0 | 0 |
| 1 | 1 | 1 | 0 |

Figure 2:
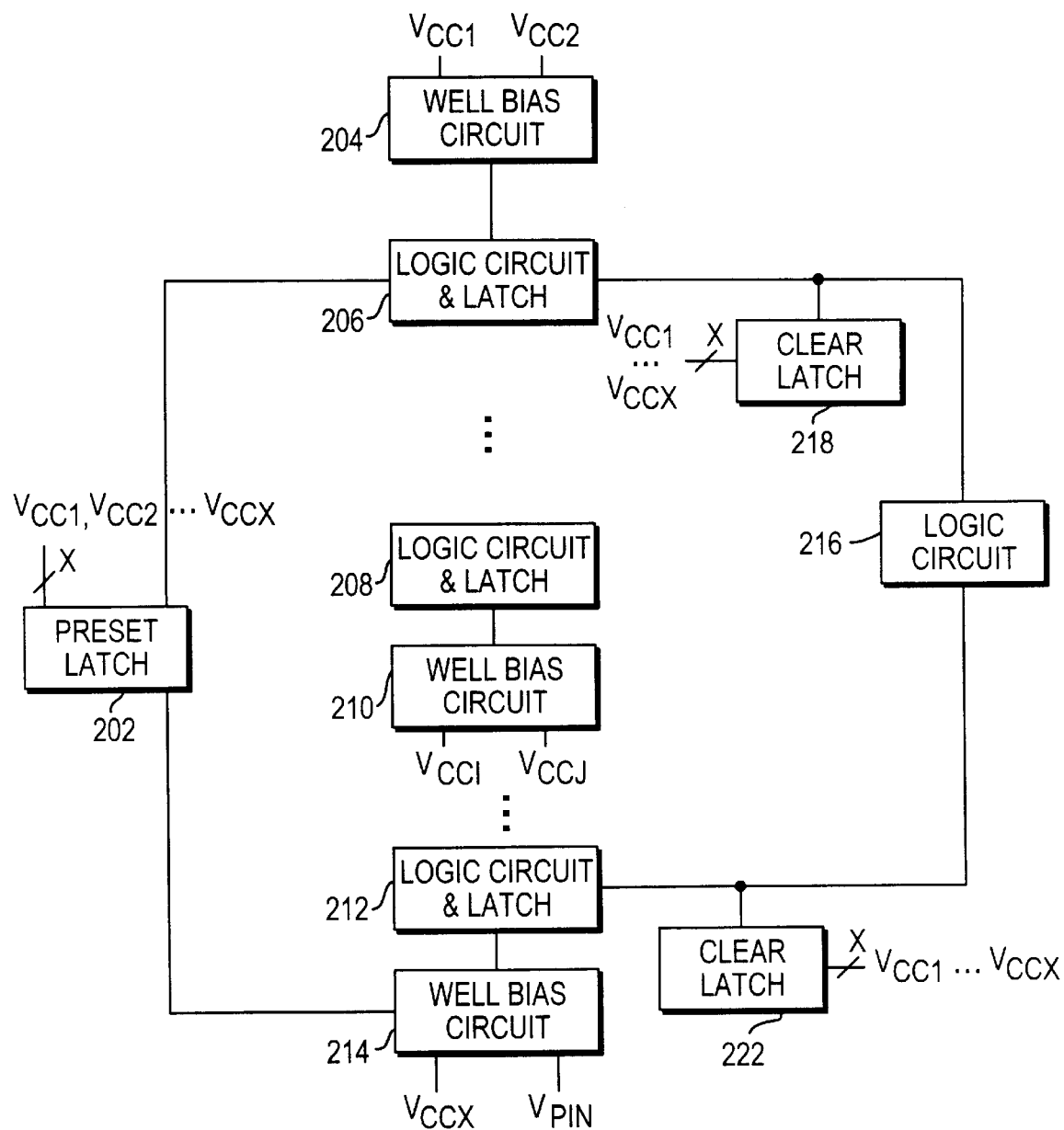
FIG. 2 is a simplified schematic block diagram showing a more generalized use of the FIG. 1 circuit in accordance with the invention.

Power detection circuits may be constructed in accordance with the present invention to monitor more power supplies than illustrated in FIG. 1. As shown in FIG. 2, illustrative power detection circuit 200 may include preset latch 202 that is coupled to power supplies, $V_{CC1}$, $V_{CC2}$, ... $V_{CCX}$. In addition, as illustrated in FIG. 2, logic circuits (and latches) 206, 208, . . . 212 may be configured to invert the output of preset latch 202 so as to drive the outputs of clear latches 218, . . . 222 to logic-1 levels in the event that any of the power supplies coupled to preset latch 202 has not reached functional voltage level. Note that logic circuits and latches (viz. 206) are not illustrated as separate elements in FIG. 2, in order to simplify the drawings, although logic circuits and latches may be implemented as separate circuits coupled to the same nodes in power detection circuit 200.

Logic circuits (and latches) 206, 208, . . . 212 are also coupled to power supplies through well bias circuits 204, 210, . . . 214 so that at least one logic circuit may be powered up as soon as one of power supplies $V_{CC1}$, $V_{CC2}$, . . . $V_{CCX}$, $V_{PIN}$ has reached functional voltage level. As soon as one of these power supplies has reached functional voltage level, logic circuit 216 may provide a signal to indicate that not all supplies have reached functional voltage levels. Logic circuit 216, which may be any suitable circuit (for example, an OR-gate or a cascade of OR-gates), may be configured to combine outputs from clear latches 218 . . . 222 so that a logic-1 level indicates that not all power supplies have reached functional voltage levels. Latches 206, 208 . . . 212 may be configured to provide the same functionality as latches 112 and 114 in FIG. 1, i.e., to provide some de-bouncing capability to power detection circuit 200.

With the arrangements shown in FIG. 1 and FIG. 2, the HOTSCKT signal indicates when $V_{CCN}$ and $V_{CCQ}$ power supplies have reached functional voltage levels.

Integrated circuit devices, for example, programmable logic devices, are generally programmed upon power up or reset. It may be desirable to hold an integrated circuit device in reset until the power supplies supplying current to the integrated circuit have reached functional voltage levels because programming prior to fully operational power supplies may damage the integrated circuit or lead to incorrect programming.

Figure 3:
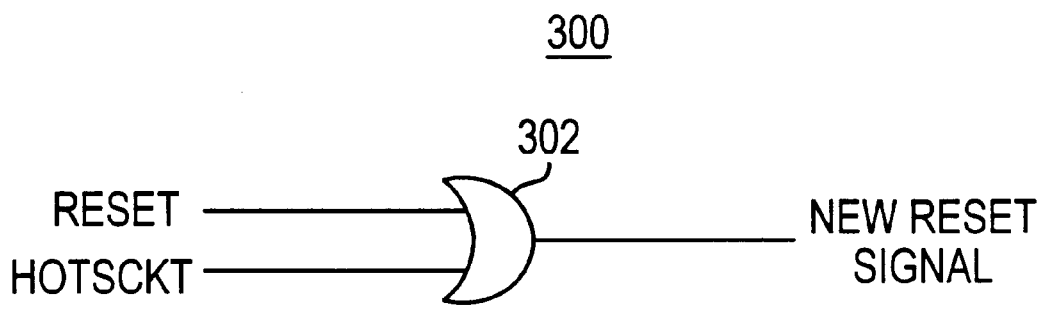
FIGS. 3–4 are simplified schematic block diagrams of an illustrative use of the FIG. 1 circuit in accordance with the invention.

FIG. 3 shows illustrative circuit 300 which includes OR gate 302 that may be configured to accept the HOTSCKT signal and a first reset signal as inputs. Thus, the output of OR gate 302 may be used as a second reset signal to keep the integrated circuit device in reset until both $V_{CCN}$ and $V_{CCQ}$ have reached functional voltage levels.

Figure 4:
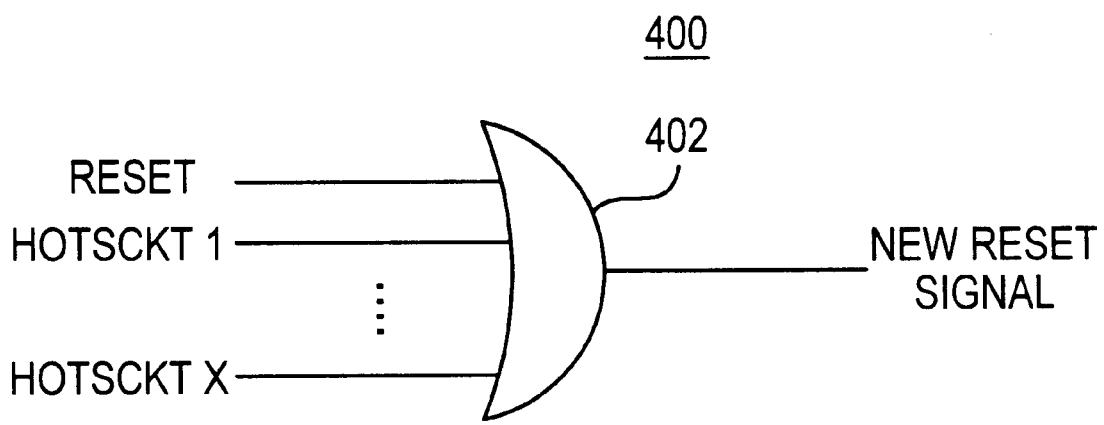

Instead of combining a single HOTSCKT signal with a reset signal, multiple HOTSCKT signals may be combined with an OR gate to keep the integrated circuit device in reset until all power supplies have reached functional voltage levels. Each HOTSCKT signal may be an indication of whether a different set of power supplies has reached functional voltage levels. As illustrated in FIG. 4, circuit 400 combines various HOTSCKT signals, HOTSCKT1 . . . HOTSCKTX to OR gate 402 (which may be replaced with a cascade of OR-gates) with a first reset signal to provide a second reset signal. The second reset signal may be used to keep the integrated circuit device in reset until all power supplies have reached functional voltage levels.

Figure 5:
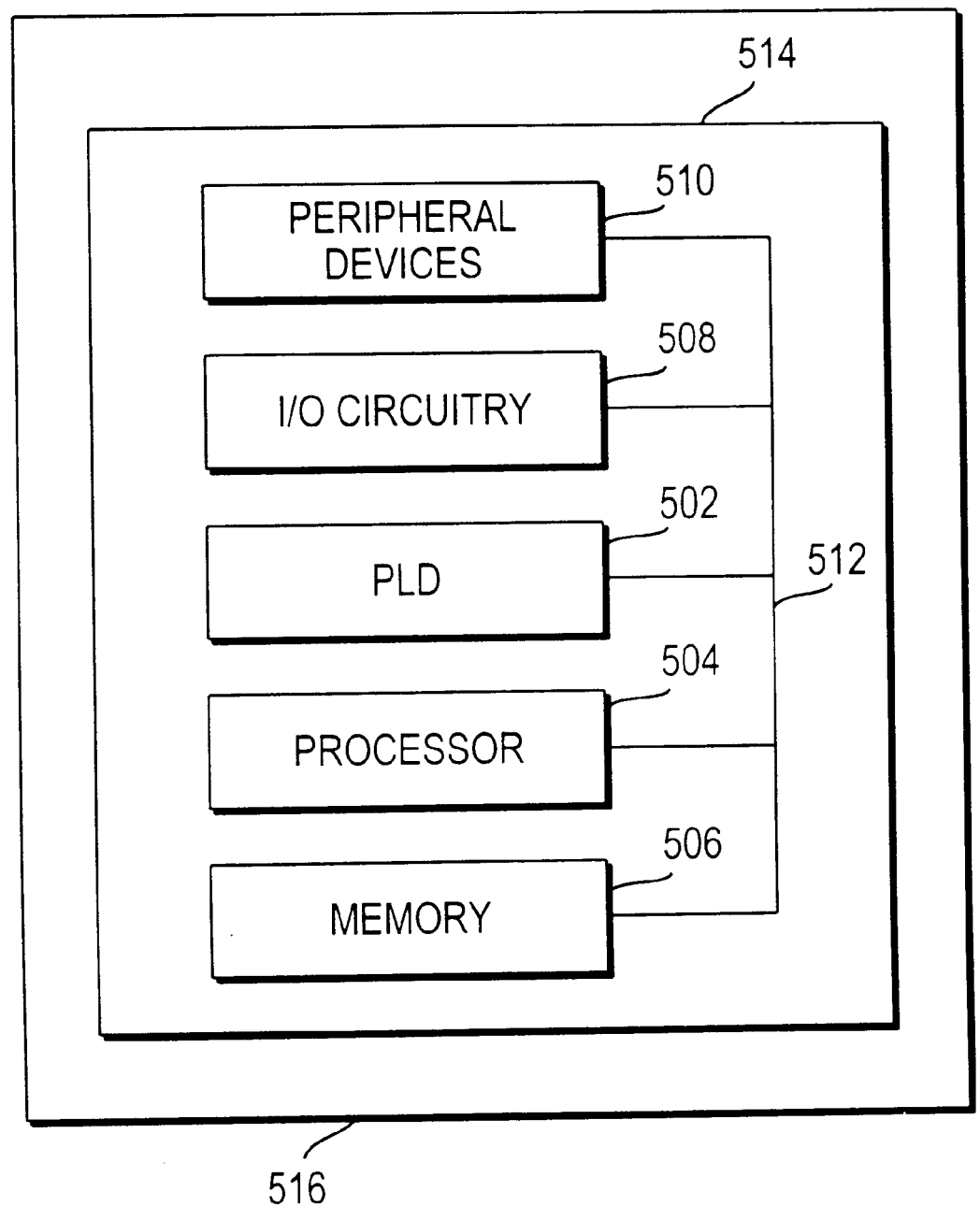
FIG. 5 is a simplified schematic block diagram of an illustrative system employing a programmable logic device in accordance with the invention.

FIG. 5 illustrates a programmable logic device 502 of this invention in a data processing system 500. Data processing system 500 may include one or more of the following components: a processor 504; memory 506; I/O circuitry 508; and peripheral devices 510. These components are coupled together by a system bus 512 and are populated on a circuit board 514 which is contained in an end-user system 516.

System 500 can be used in a wide variety of applications, such as computer networking, data networking, instrumentation, or any other application where the advantage of using programmable or reprogrammable logic is desirable. Programmable logic device 502 can be used to perform a variety of different logic functions. For example, programmable logic device 502 can be configured as a processor or controller that works in cooperation with processor 504. Programmable logic device 502 may also be used as an arbiter for arbitrating access to a shared resource in system 500. In yet another example, programmable logic device 502 can be configured as an interface between processor 504 and one of the other components in system 500. It should be noted that system 500 is only exemplary, and that the true scope and spirit of the invention should be indicated by the following claims.

Various technologies can be used to implement programmable logic device 502 in accordance with this invention. For example, programmable logic devices can be implemented with EPROMs, EEPROMS, pass transistors, transmission gates, fuses, antifuses, laser fuses, metal optional links, ferro-electric memories, or any suitable combination thereof. From the various examples mentioned above, it will be seen that this invention is applicable to both OTP ("One Time Programmable") and reprogrammable devices.

It will be understood that the foregoing is only illustrative of the principles of the invention, and that various modifications can be made by those skilled in the art without departing from the scope and spirit of the invention. For example, HOTSCKT signals may be combined with other signals in an integrated circuit device, in addition to a reset signal, so that other operations that depend on power supplies reaching functional voltage levels may be conditioned on the HOTSCKT signals. As another example of modifications within the scope of the invention, a HOTSCKT signal may be provided that is based on monitoring the power supplies that supply current to the circuits surrounding each region of programmable logic in a programmable logic device.

What is claimed is:

1. A power detection circuit coupled to a plurality of power supplies that provides an output signal that is at a first logic level when at least one of the power supplies has not reached functional voltage level, and is at a second logic level when all of the power supplies have reached functional voltage levels, comprising:

a preset latch and a clear latch that are coupled to the power supplies, wherein the output signal is substantially related to an output of the clear latch;

a logic circuit that is coupled between the preset latch and the clear latch; and a well bias circuit that is coupled to the logic circuit and at least two of the power supplies.

2. The power detection circuit of claim 1 wherein the logic circuit provides an inverted version of an output of the preset latch to the clear latch.

3. The power detection circuit of claim 2, wherein the output of the preset latch is at a fixed logic level when at least one of the power supplies to which the preset latch is coupled is not at functional voltage level.

4. The power detection circuit of claim 2, wherein the output of the preset latch is tri-stated when none of the power supplies to which the preset latch is coupled is not at functional voltage level.

5. The power detection circuit of claim 2, wherein the output of the clear latch is an inverted version of the output of the preset latch when the logic circuit is supplied with current from the well bias circuit.

6. The power detection circuit of claim 1, wherein the clear latch is coupled to a fixed voltage potential.

7. The power detection circuit of claim 6, wherein the clear latch outputs a signal at a logic level substantially related to the fixed voltage potential when none of the power supplies to which the preset latch is coupled is not at functional voltage level.

8. The power detection circuit of claim 1, wherein the preset latch comprises a plurality of diode-connected transistors, wherein each of the diode-connected transistors is coupled to a different one of the power supplies to which the preset latch is coupled.

9. The power detection circuit of claim 1, wherein the clear latch comprises a plurality of transistors connected in series with each other, wherein a base/gate terminal of each of the transistors is coupled to a different one of the power supplies to which the clear latch is coupled.

10. The power detection circuit of claim 1 further comprising a control circuit, wherein:
   a control signal is provided to the control circuit as a first input;
   the output signal is provided to the control circuit as a second input; and
   the control circuit provides a signal that is asserted when both the control signal and the output signal are asserted.

11. The control circuit of claim 10, wherein the control signal is a reset signal.

12. The power detection circuit of claim 1, wherein the power supplies provide current of at least two different voltages.

13. A power detection circuit coupled to a plurality of power supplies that provides an output signal that is at a first logic level when at least one of the power supplies has not reached functional voltage level, and is at a second logic level when all of the power supplies have reached functional voltage levels, comprising:
   a preset latch coupled to the power supplies;
   a plurality of clear latches, wherein each of the clear latches is coupled to the power supplies;
   a plurality of logic circuits, wherein each of the logic circuits is coupled between the preset latch and an associated one of the clear latches;
   a plurality of well bias circuits, each of which is associated with a respective one of the logic circuits, wherein each of the well bias circuits is coupled to at least two of the power supplies and supplies the associated logic circuit with current from a first power supply to reach functional voltage level; and
   a combinatorial circuit that combines outputs from each of the clear latches to provide the output signal.

14. The power detection circuit of claim 13, wherein each of the logic circuits provides an inverted version of an output from the preset latch to the associated clear latch.

15. The power detection circuit of claim 14, wherein the output from the preset latch is at a fixed logic level when at least one of the power supplies to which the preset latch is coupled is not at functional voltage level.

16. The power detection circuit of claim 14, wherein the output from the preset latch is tri-stated when none of the power supplies to which the preset latch is coupled is not at functional voltage level.

17. The power detection circuit of claim 16, wherein an output of each of the clear latches is an inverted version of the output of the preset latch when the associated logic circuit is supplied with current from the associated well bias circuit.

18. The power detection circuit of claim 13, wherein each of the clear latches is coupled to a fixed voltage potential.

19. The power detection circuit of claim 18, wherein each of the clear latches outputs a signal at a logic level substantially related to the fixed voltage potential when none of the power supplies to which the preset latch is coupled is not at functional voltage level.

20. The power detection circuit of claim 13, wherein the combinatorial circuit is an OR-gate.

21. The power detection circuit of claim 13, wherein the combinatorial circuit is a cascade of OR-gates.

22. The power detection circuit of claim 13, wherein the preset latch comprises a plurality of diode-connected transistors wherein each of the diode-connected transistors is coupled to a different one of the power supplies to which the preset latch is coupled.

23. The power detection circuit of claim 13, wherein each of the clear latches comprises a plurality of transistors connected in series with each other, wherein a base/gate terminal of each transistor is coupled to a different one of the power supplies to which the clear latch is coupled.

24. The power detection circuit of claim 13 further comprising a control circuit, wherein:
   a control signal is provided to the control circuit as a first input;
   the output signal is provided to the control circuit as a second input; and
   the control circuit provides a signal that is asserted when both the control signal and the output signal are asserted.

25. The control circuit of claim 24, wherein the control signal is a reset signal.

26. The power detection circuit of claim 13, wherein the power supplies provide current of at least two different voltages.

27. A programmable logic device comprising:
   a power detection circuit coupled to a plurality of power supplies that provides an output signal that is at a first logic level when at least one of the power supplies has not reached functional voltage level, and is at a second logic level when all of the power supplies have reached functional voltage levels, further comprising:
   a preset latch and a clear latch that are coupled to the power supplies, wherein the output signal is substantially related to an output of the clear latch;
   a logic circuit that is coupled between the preset latch and the clear latch; and
   a well bias circuit that is coupled to the logic circuit and at least two of the power supplies.

28. A digital processing system comprising:
   processing circuitry;
   a memory coupled to said processing circuitry; and
   a programmable logic device as defined in claim 27 coupled to the processing circuitry and the memory.

29. A printed circuit board on which is mounted a programmable logic device as defined in claim 27.

30. The printed circuit board defined in claim 29 further comprising:
   a memory mounted on the printed circuit board and coupled to the programmable logic device.

31. The printed circuit board defined in claim 29 further comprising:
   processing circuitry mounted on the printed circuit board and coupled to the programmable logic device.

* * * * *